(12) United States Patent  
Avella et al.

(10) Patent No.: US 6,548,983 B2
(45) Date of Patent: Apr. 15, 2003

(54) PWM-PULSE CONTROL SYSTEM

(75) Inventors: Leonardo Dino Avella, Crema (IT); Giuseppe Palma, Crema (IT); Antonino Cuce', Crema (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/878,718

(22) Filed: Jun. 11, 2001

(65) Prior Publication Data

US 2002/0050803 A1 May 2, 2002

(30) Foreign Application Priority Data

Jun. 13, 2000 (IT) ................................. MI2000A001322

(51) Int. Cl.[7] .............................................. G05B 11/28
(52) U.S. Cl. ..................... 318/599; 318/798; 318/811; 323/239; 323/324
(58) Field of Search ................... 323/239, 324; 318/811, 599, 798

(56) References Cited

U.S. PATENT DOCUMENTS

| 4,162,440 | A | * | 7/1979 | Luteran | 323/22 SC |
|---|---|---|---|---|---|
| 4,163,931 | A | * | 8/1979 | Seitz et al. | 318/569 |
| 4,176,288 | A | * | 11/1979 | Komatsu et al. | 307/252 A |
| 4,302,717 | A | * | 11/1981 | Olla | 323/282 |
| 4,504,778 | A | * | 3/1985 | Evans | 323/323 |
| 4,710,686 | A | * | 12/1987 | Guzik | 318/293 |
| 5,081,411 | A | * | 1/1992 | Walker | 323/326 |
| 5,302,889 | A | * | 4/1994 | Marsh | 323/284 |
| 5,402,052 | A | * | 3/1995 | Cheng et al. | 318/696 |
| 5,914,984 | A | * | 6/1999 | Di Guardo et al. | 375/238 |
| 6,307,345 | B1 | * | 10/2001 | Lewis | 318/696 |

* cited by examiner

Primary Examiner—Marlon T. Fletcher
Assistant Examiner—Rina I. Duda
(74) Attorney, Agent, or Firm—Lisa K. Jorgenson; Dennis M. de Guzman; Seed IP Law Group PLLC

(57) ABSTRACT

A power modulation control system using PWM pulses is provided. The system comprises an AC voltage generator, an electric load, and a control circuit incorporating at least one rectifier. The electric load is connected between the generator and the rectifier, and first and second monodirectional switches are connected in parallel with the load.

40 Claims, 14 Drawing Sheets

PWM-PULSE CONTROL SYSTEM

TECHNICAL FIELD

The present invention relates to a PWM-pulse control system.

Specifically this invention relates, particularly but not exclusively, to a PWM-pulse control system for electric motors.

BACKGROUND OF THE INVENTION

As is well known in this technical field, PWM (Pulse-Width Modulation) control signals are used in a large variety of electronic systems. In particular, they are used in DC/AC converters, PWM inverters to drive AC motors, and PLL (Phase-Locked Loops) control systems.

Recent developments in DC/AC converters have allowed the use of asynchronous motors to be extended to a broader range of industrial applications. In the past, asynchronous motors were only available for operation at frequency and voltage ratings set by their manufacturers.

In order to generate appropriate drive signals to an asynchronous motor at varying voltage and frequency, modulation techniques are required that utilize PWM signals. An example of such techniques is described in the Applicant's U.S. Pat. No. 5,914,984. However, that technique is useful only in cases where voltage and current are phased to each other.

Furthermore, driving universal motors powered by the standard 220V AC power supply reference has a major problem in that the power input must be regulated to:

minimize electromagnetic emissions;

minimize power consumption; and minimize the so-called output torque ripple.

More particularly, electromagnetic emissions from electric motors are to comply with international standards (e.g., European Standard EN 55014) established by survey of the emission spectra of signals at the terminals of the universal motor. The ideal is a zero-power emission spectrum at all frequencies, only showing a peak at 50 Hz, i.e. at the frequency of the AC power supply reference. Alternatively, the peak could locate at 0 Hz if a DC power supply is used.

It should be further considered that the amount of power dissipated through the electronic control of universal motors is made trivial, compared to that absorbed through the motor, by resorting to phase clipping and PWM modulation.

Conventional solutions to the problem of regulating the input power to a universal motor provide for:

amplitude modulation, using a potentiometer;

phase clipping through a triac; and width modulation of a rectified-wave PWM signal.

An amplitude modulation controller using a potentiometer is shown schematically at 1 in FIG. 1. The controller 1 is connected across the terminals M1 and M2 of a universal motor 2 and is powered by a generator 3. In particular, the generator 3 may be the power supply reference at 220V. The controller 1 basically comprises a potentiometer having an equivalent load resistance R.

This amplitude modulation approach using a potentiometer represents a substantially perfect solution to the problem of keeping electromagnetic emission low. The power spectrum of the signal across the load comprising the motor 2 shows a peak at the 50 Hz frequency of the power supply 3 and nothing else.

Unfortunately, this is also the approach that involves maximum power dissipation. In particular, with the motor 2 stopped, the power dissipated is:

Pdiss=R*(I^2) where,

Pdiss is the power dissipated,

R is the equivalent resistance of the potentiometer 1, and

I is the current flowing through the potentiometer 1.

On the other hand, with the motor 2 at full speed, the resistance RL of the universal motor is far below the resistance R of the potentiometer 1, and all the power is actually used up by the motor 2.

In any intermediate range of operation, some of the power is dissipated through the resistance R of the potentiometer 1, thereby raising power consumption to an unacceptably high level. It is for this reason that amplitude modulation is not widely made use of in actual practice to regulate the input power to universal electric motors.

The second of the above-listed solutions provides a controller with phase modulation using a triac, as shown schematically in FIG. 2. This controller, generally designated 4, is connected to one terminal M2 of a universal motor 2 and to a ground reference GND of a power supply reference 3.

The controller 4 comprises essentially a triac, having a control terminal TC4 connected to an external microcontroller MCU, not shown because conventional.

This would be the ideal approach from the standpoint of power consumption, were it not for a number of disadvantages, among which:

the output torque of the motor is not constant and shows a considerable torque ripple, especially at medium powers; as a result, the motor shaft is more heavily stressed than in other PWM approaches, so that the motor becomes very noisy and less reliable the time being;

the power spectrum of the signal across the electric motor is deeply affected at all frequencies by electric noise impossible to suppress even with sophisticated filters.

FIGS. 3A and 3B respectively show a normalized time signal across the motor plotted against time, and a power spectrum plotted against frequency for a phase modulation controller using a triac as described in relation to FIG. 2.

The third of the above-listed solutions provides for power modulation controllers using a PWM pulse, as shown in FIG. 4.

In particular, a controller of this type, designated 5, is connected between one terminal M1 of a universal motor 2 and a power supply reference 3, and comprises basically a diode bridge 6 having two input terminals T1, T3 and two output terminals T2, T4.

In addition, the controller 5 comprises a capacitor CAP connected in parallel between the output terminals T2, T4 of the diode bridge 6.

The second, T4, of said output terminals is connected to a ground reference GND, while the input terminals T1 and T3 of the diode bridge 6 are connected to the power supply 3.

The controller 5 further comprises an output power transistor Q connected between the other terminal M2 of the motor 2 and said ground reference GND. This transistor Q has a control terminal TC5 connected to a control output of an external microcontroller MCU, not shown because conventional.

The operation of this PWM controller 5 will now be described. The power supply 3 is rectified through the diode bridge 6 and converted to a DC signal through the capacitor CAP, which is here a large electrolytic capacitor. Only at this point, the PWM modulation is applied.

Therefore, power consumption through the controller 5 is fairly low, since all of the power from the power supply 3 goes into the motor 2. However, periodical charge/discharge cycling of the capacitor introduces a time variation in the rectified voltage across the load, as shown in FIG. 5A.

Thus, a signal is obtained that has a power spectrum with a large DC component, but significant noise at low frequencies, as can be seen from the log scale spectrum in FIG. 5B.

Using the electrolytic capacitor CAP also leads to increased circuit area requirements, while representing a critical factor in a high-temperature environment.

SUMMARY OF THE INVENTION

An embodiment of this invention provide a power regulating and modulating system for the power supplied to electric motors, preferably by means of PWM signals, which system has appropriate structural and functional features to operate without large capacitors, thereby overcoming the limitations of prior control systems and controllers.

One of the concepts behind embodiments of this invention is to provide a control system with power modulation of an unrectified PWM pulse, the load being connected between the power supply and the rectifier.

The features and advantages of the control system according to the invention will be apparent from the following description of an embodiment thereof, given by way of non-limitative example with reference to the accompanying drawings.

DETAILED DESCRIPTION OF THE INVENTION

Figure 1:
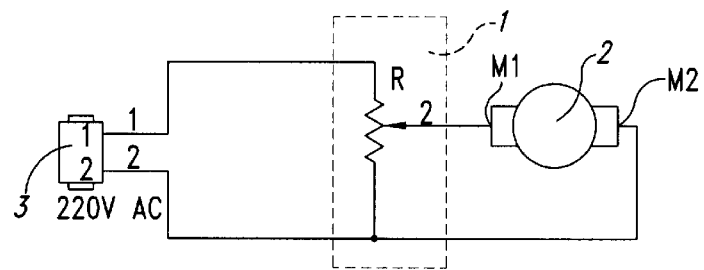
FIG. 1 is an amplitude-modulation control system for regulating the electric power supplied to a load by means of a potentiometer type of controller, according to the prior art.
Figure 2:
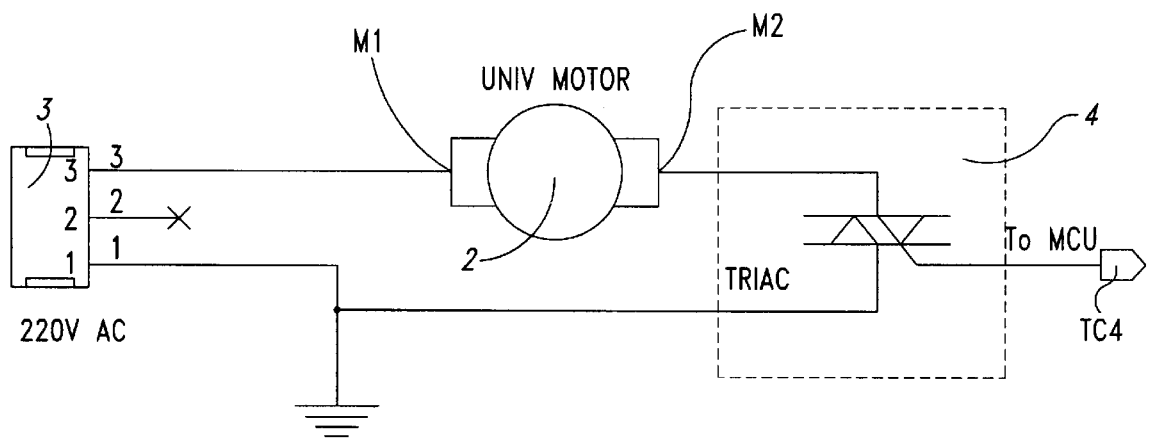
FIG. 2 is a phase-clipping control system using a triac type of controller, according to the prior art.
Figure 3A:
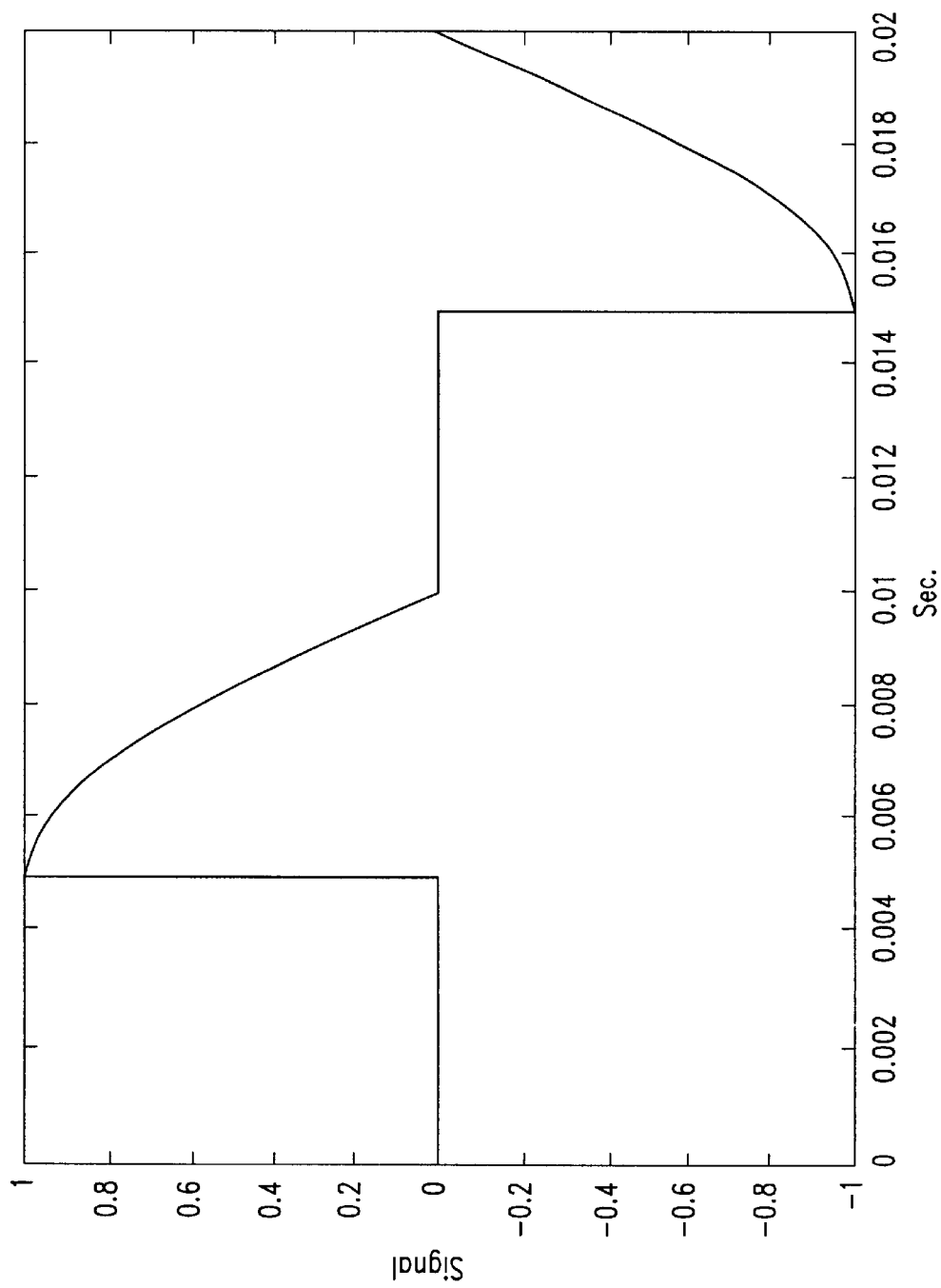
FIGS. 3A and 3B are plots of signals of the system of FIG. 2.
Figure 3B:
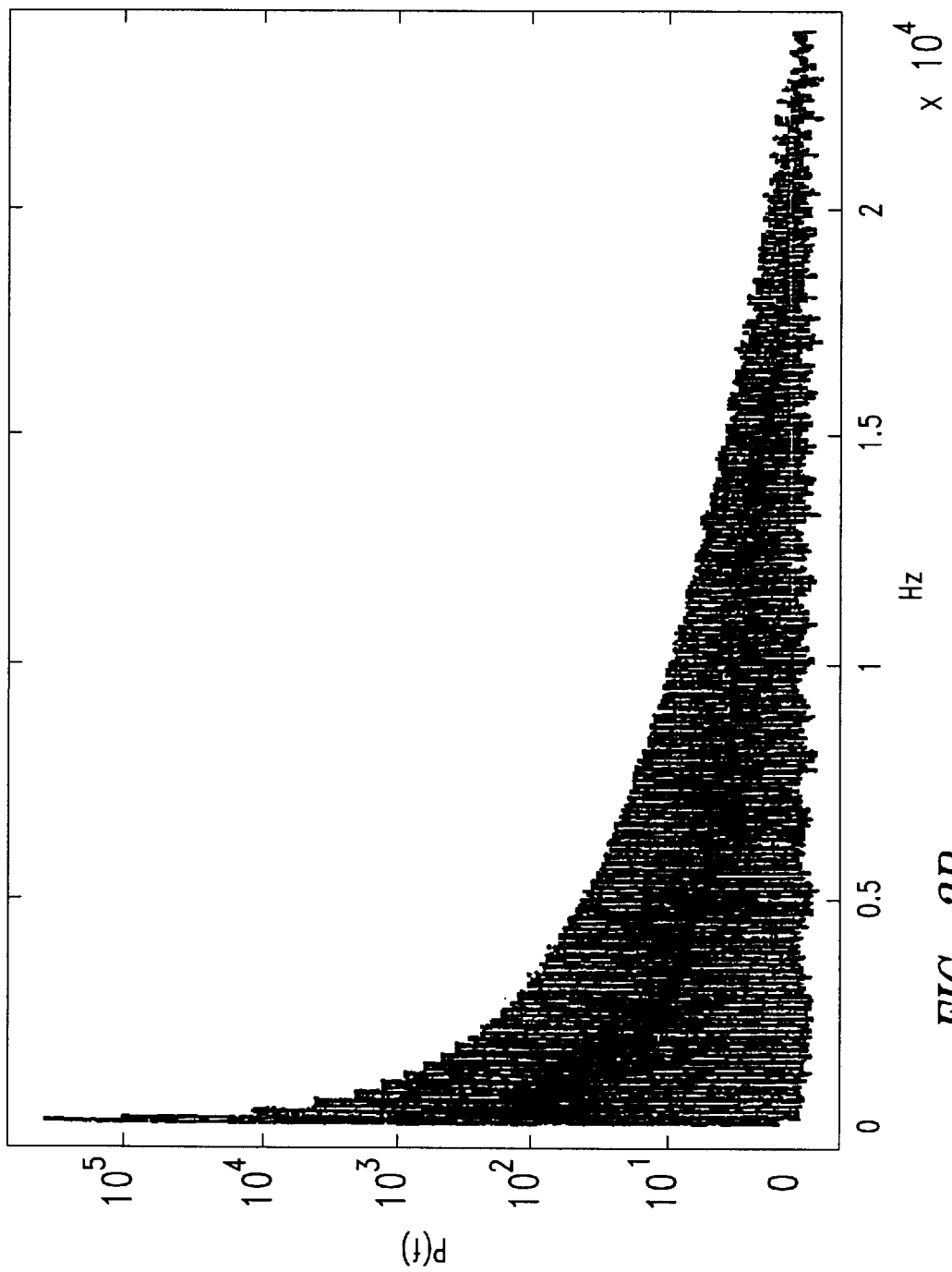
Figure 4:
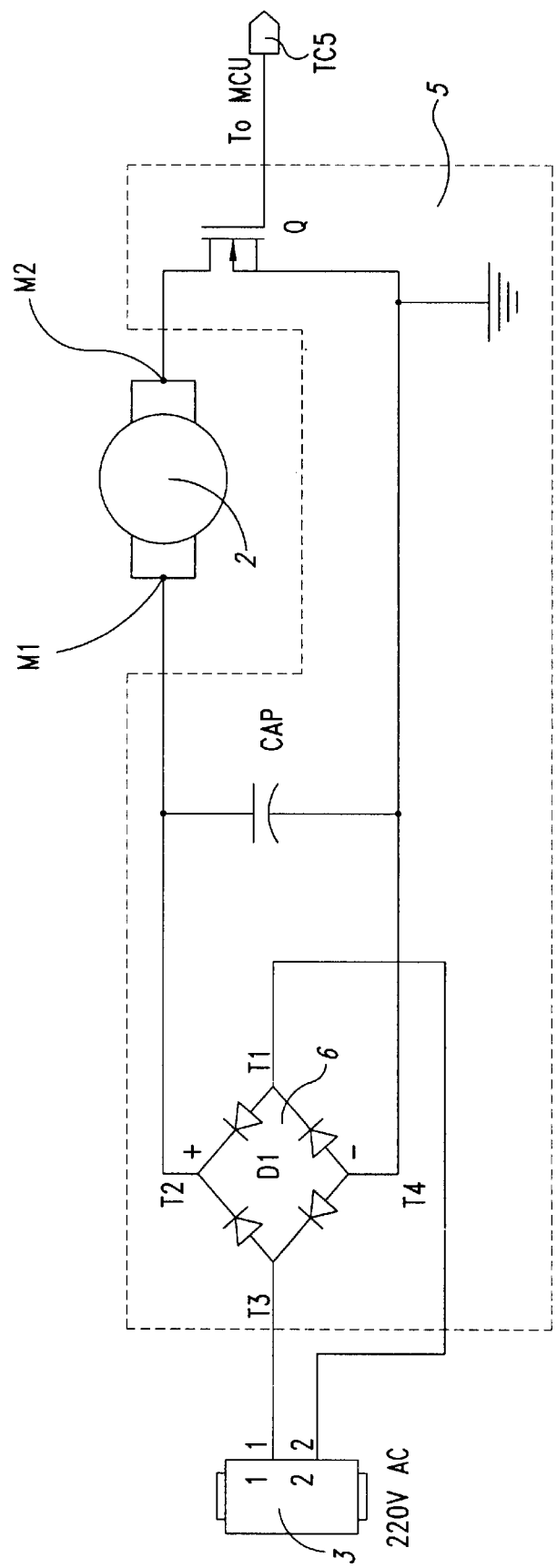
FIG. 4 is a PWM control system for regulating the electric power to a load by means of a controller that incorporates a rectifier, according to the prior art.
Figure 5A:
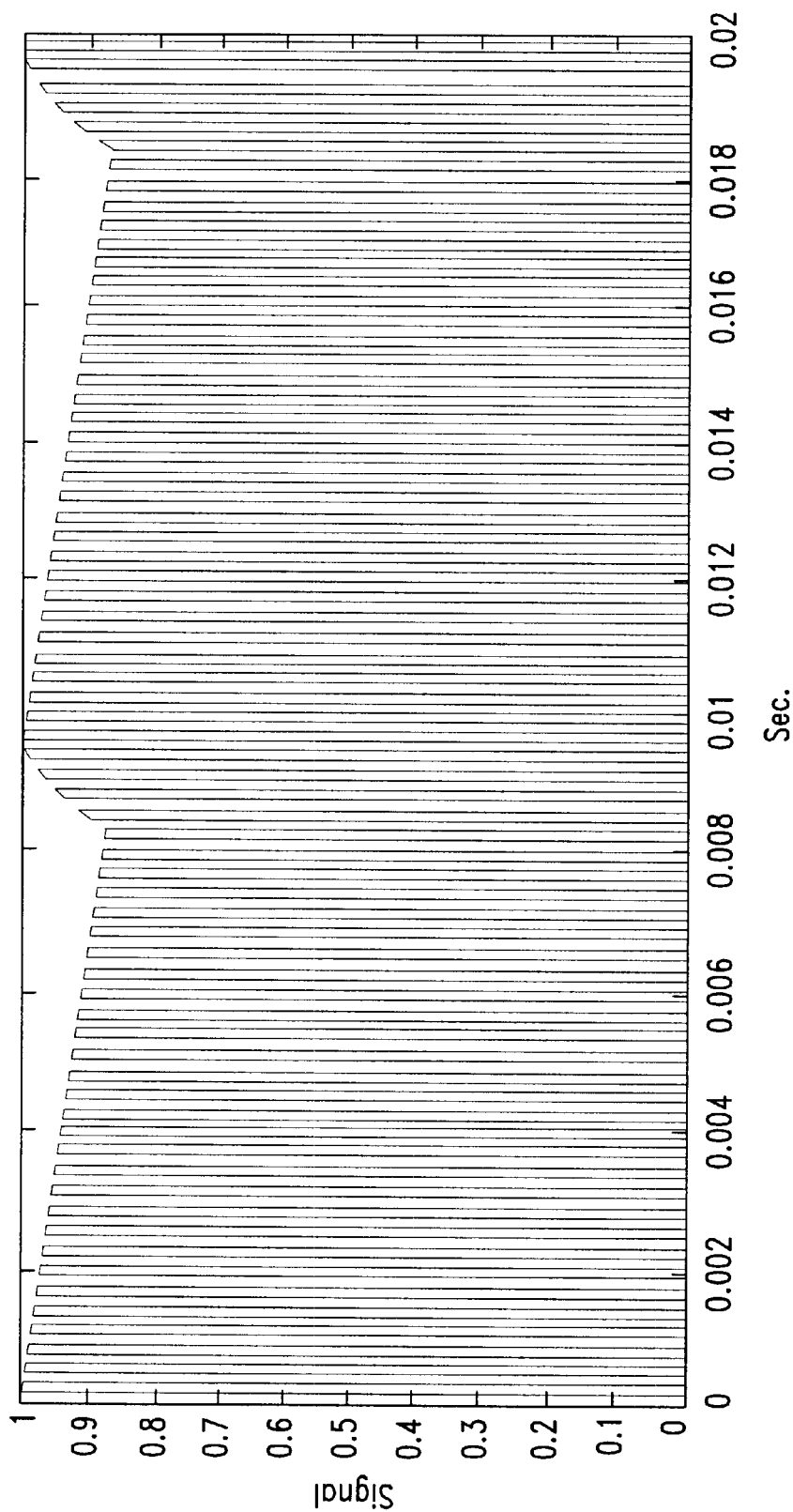
FIGS. 5A and 5B are plots of signals of the system of FIG. 4.
Figure 5B:
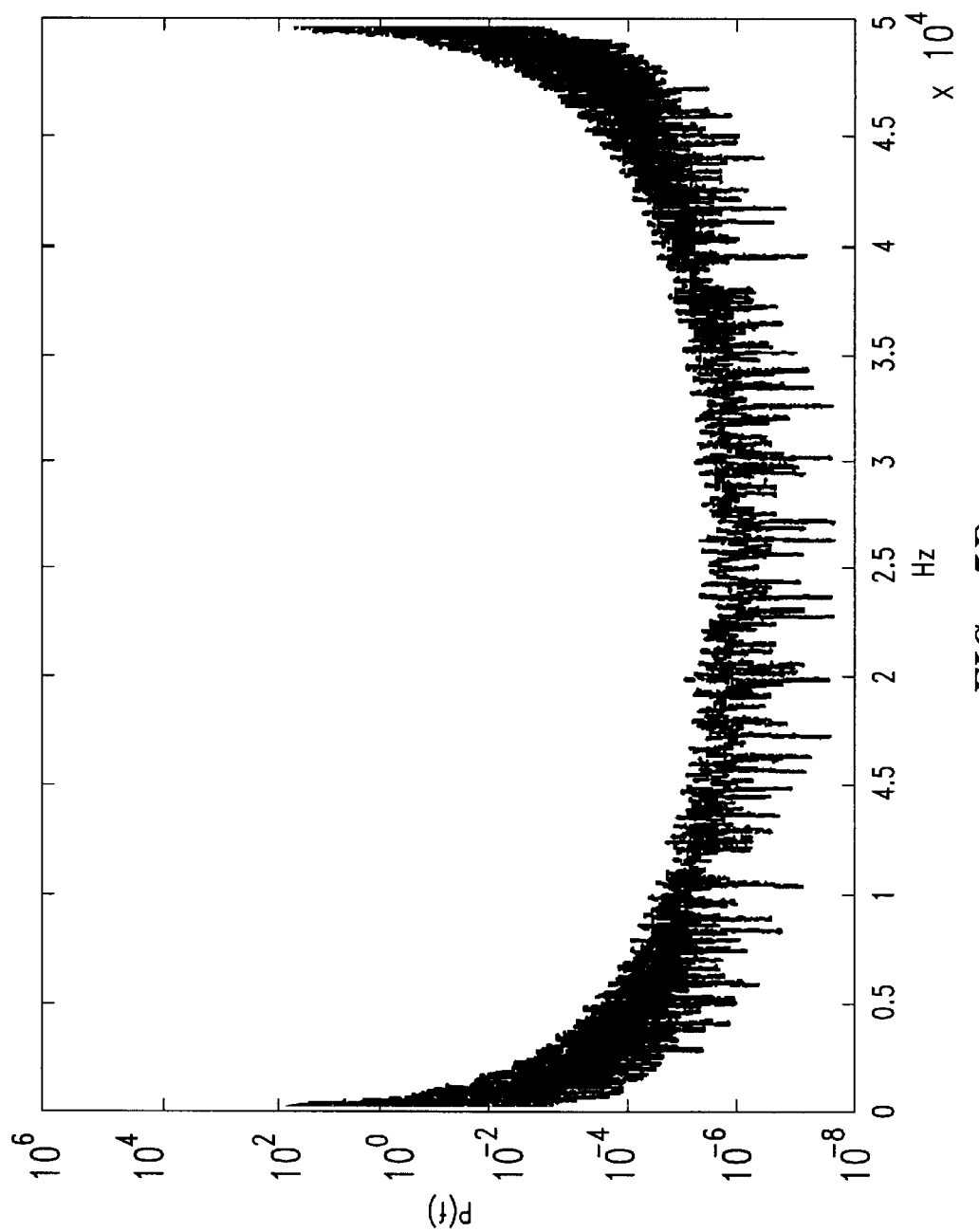
Figure 6:
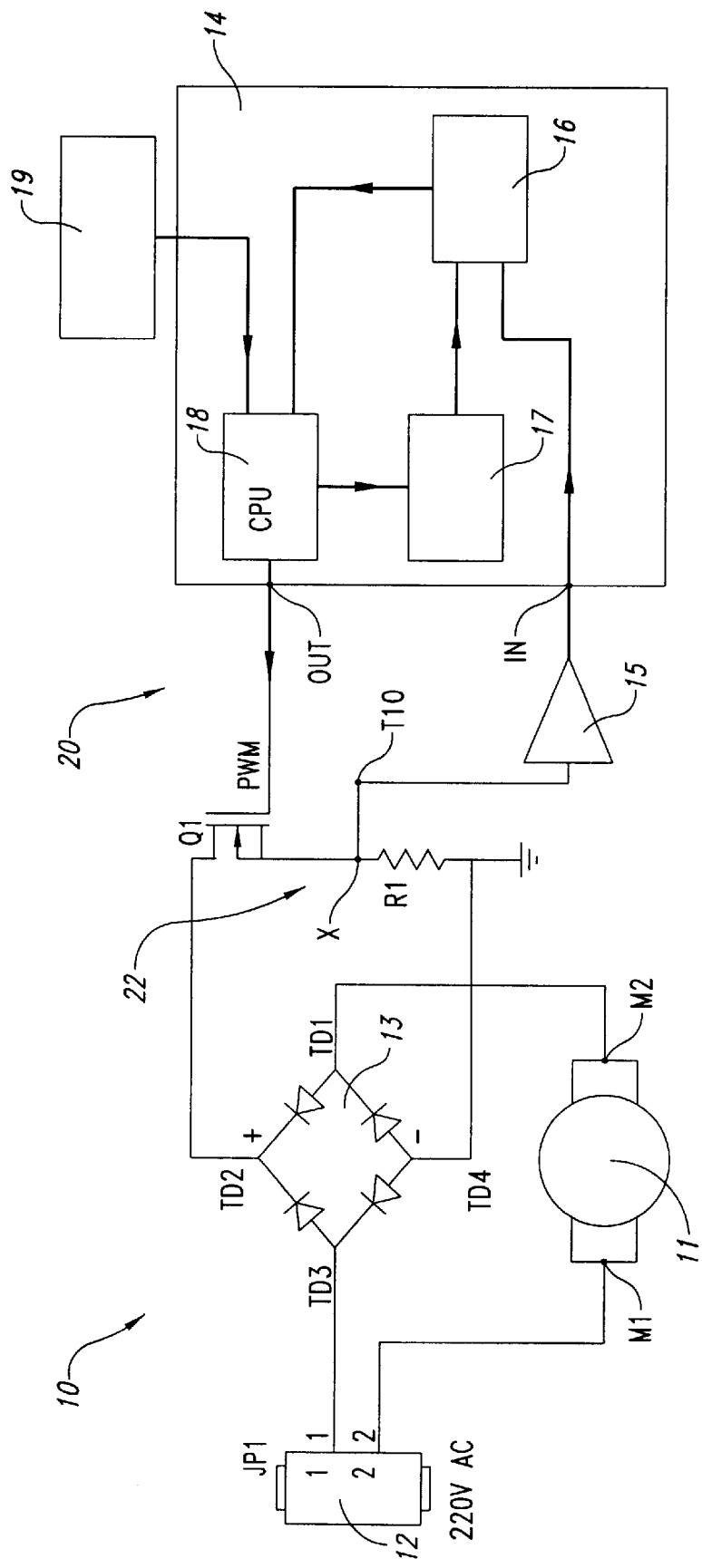
FIG. 6 is a control system according to the present invention.

With reference to the drawings, in particular to FIG. 6, a power modulation control system according to the present invention is shown generally at 10. The system 10 is to apply PWM pulses to an electric load, specifically an AC-powered electric motor having a pair of terminals M1, M2.

In a preferred embodiment, the motor 11 is a universal motor, i.e. has the stator winding connected in series with the rotor winding. In this design, the magnetic flux is proportional to the current flowing through the motor windings.

Accordingly, torque is proportional to the square of the current. Neglecting losses, the mechanical power delivered will equal the electric power input from the power supply.

The control system 10 comprises a control circuit 20 adapted to modulate the width of a PWM pulse for supply to the motor 11.

Thus, the control circuit 20 acts to regulate the electric power to the motor 11, and for this purpose is supplied by means of an AC voltage generator 12.

The generator 12 may be the 220V power supply reference or any equivalent power supply having a first terminal at a potential V1 and a second terminal at a potential V2.

The control system 10 comprises a rectifier 13, such as a diode bridge circuit having first TD1 and second TD3 input terminals and first TD2 and second TD4 output terminals.

The first input terminal TD1 of the rectifier 13 in the control system 20 is connected to one terminal, M2, of the motor 11, and the second input terminal TD3 of the rectifier 13 is connected to a terminal of the generator 12.

Advantageously, the other terminal M1 of the motor 11 is connected to a second terminal of the generator 12, so that the electric load 11 will be connected essentially between said generator 12 and the rectifier 13.

The control circuit 20 also comprises a circuit leg 22 formed of a series of a power transistor, such as a MOS transistor Q1, and a resistor R1. This circuit leg is placed in parallel at the output of the rectifier 13 represented by the terminals TD2 and TD4.

The second output terminal TD4 is also connected to a power supply reference, such as a ground GND.

The point of interconnection of the transistor Q1 and the resistor R1 defines a sense node X whereby the rotational speed of the motor 11 can be assessed by a measurement of current draw by the resistor R1. The node X is coupled to an input IN of a microcontroller 14 through a buffer 15.

The microcontroller 14 comprises a CPU 18 having its output connected to a voltage deduction circuit 17 whose output is connected to an input of a speed assessing circuit portion 16. All these are provided within the microcontroller 14.

The circuit portion 16 is also input the signal from the input IN of the microcontroller 14, and outputs a signal that is fed back into the CPU 18. The latter is further input a signal from a target speed device 19 external of the microcontroller 14.

An output OUT of the CPU 18 is connected directly to the control terminal of the transistor Q1 to apply a PWM signal thereto.

The operation of the control system according to an embodiment of the invention will now be described briefly.

The power transistor Q1 is driven through its control terminal by a PWM signal having a varying duty cycle at a constant frequency, such frequency being however much higher than 50 Hz, and having adequate amplitude to turn on and off the power transistor Q1.

The power input to the electric load 11 is varied by varying said duty cycle.

The combined information of current through and average voltage across the motor, which voltage is a function of the duty cycle, provides an estimate of the universal motor's impedance, and therefore, of the motor's rotational speed at any given instant. In this way, no speed sensors need be used that complicate the circuit and push up its cost. The microcontroller 14 is thus enabled to control the speed of the universal motor by acting on the duty cycle of the PWM signal.

Figure 8:
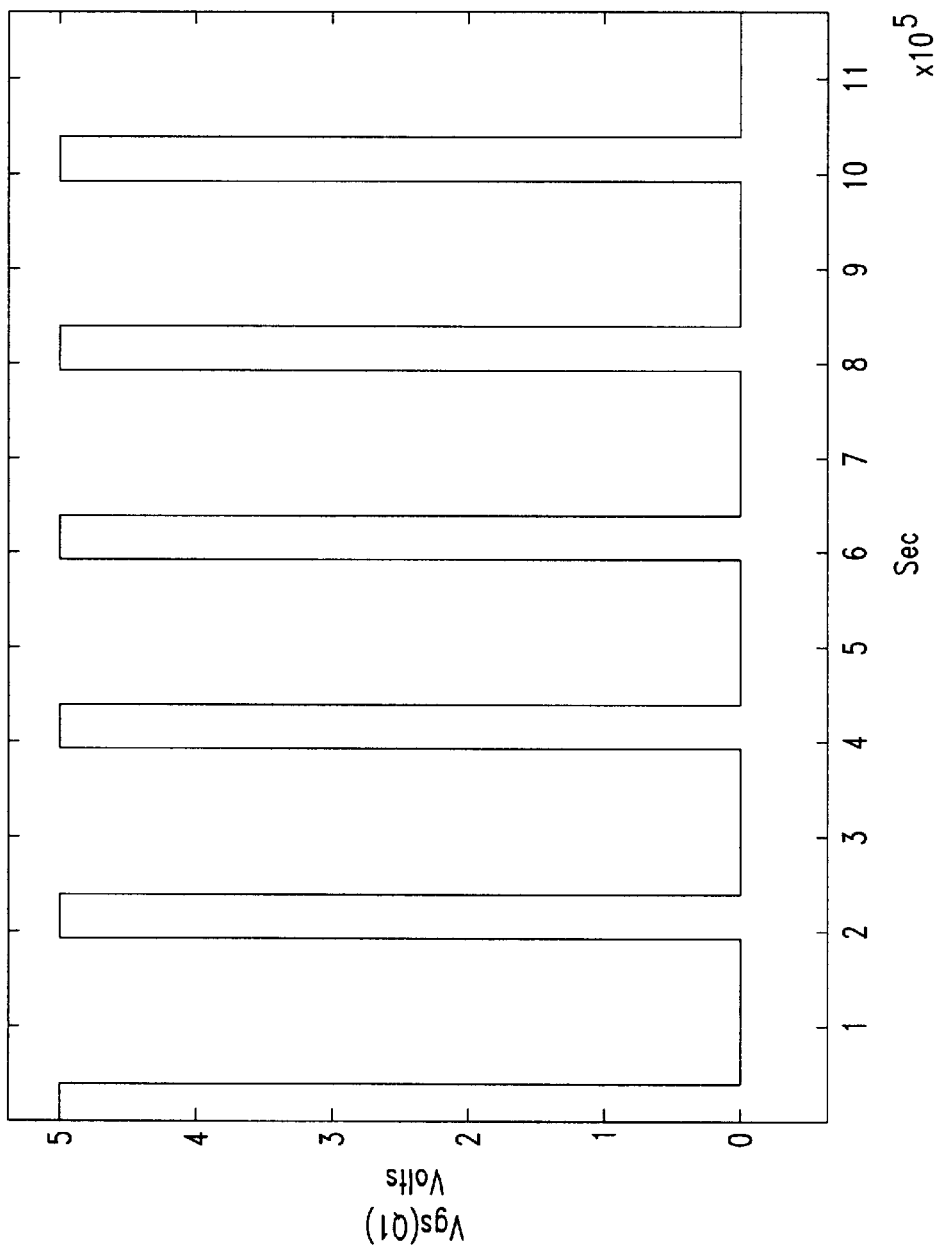
FIG. 8 is a plot of a PWM signal generated by a control circuit incorporated in the system according to the invention.

As an example, FIG. 8 shows a PWM signal generated by the microcontroller 14 at a frequency of 50 kHz and with a duty cycle of 0.25.

Figure 7A:
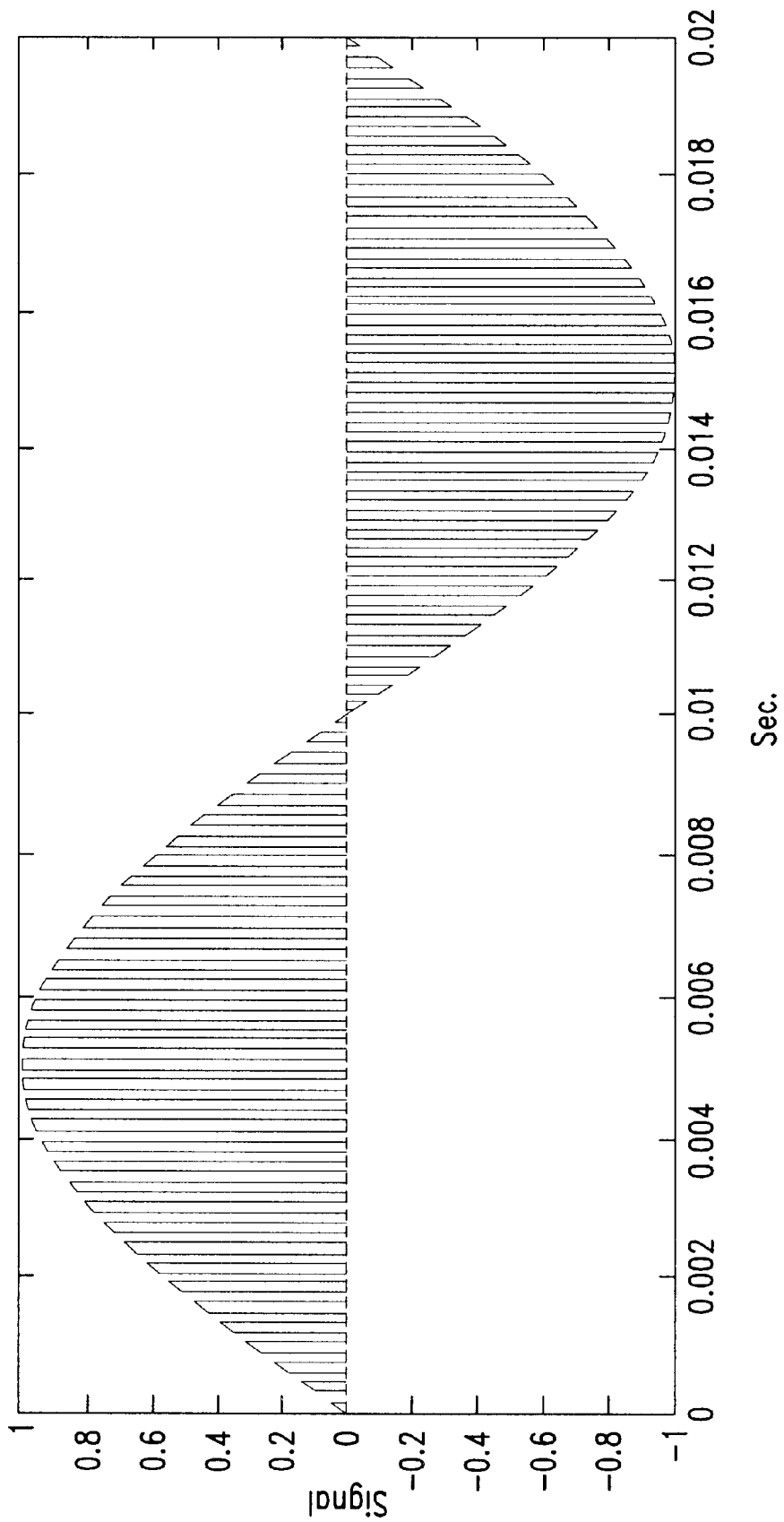
FIGS. 7A, 7B and 7C are plots of signals of the system of FIG. 6.

Shown in FIG. 7A is the PWM time signal normalized, as seen from the terminals M1, M2 of the load 11.

Figure 7B:
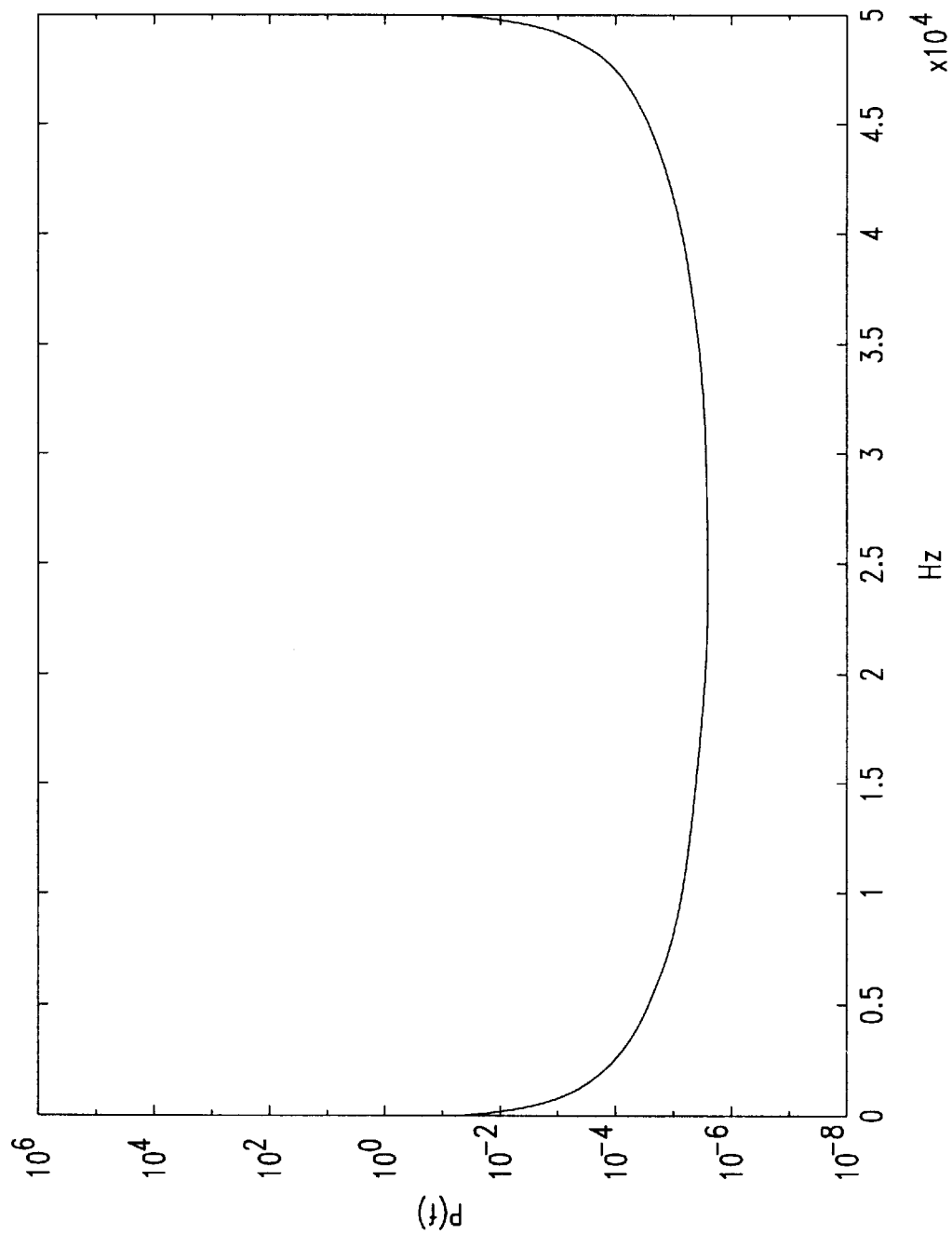
Figure 7C:
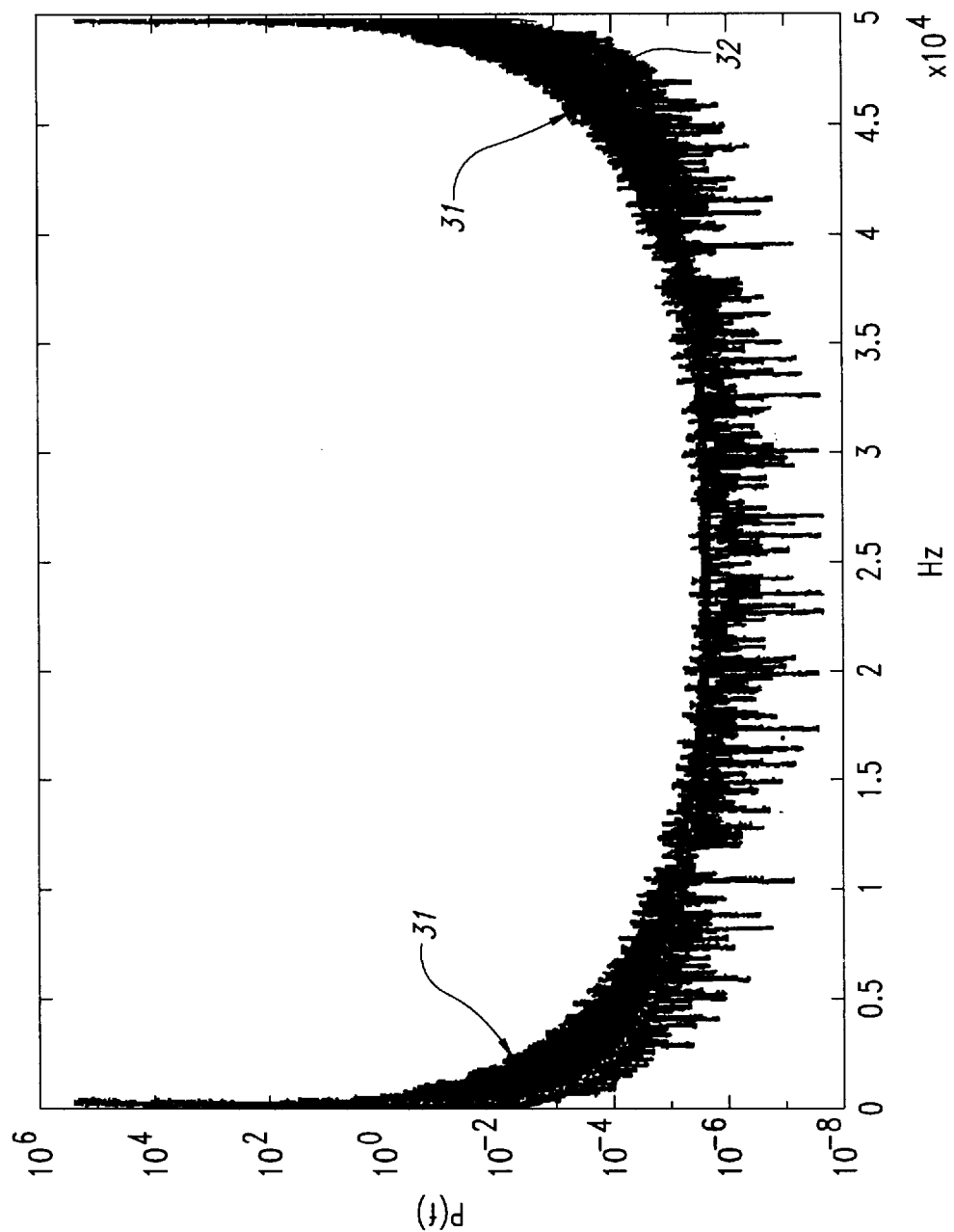

The power spectrum is practically trivial at any frequencies other than the 50 Hz of the power supply reference and the PWM signal, as is brought out by the semilogarithmic scale spectrum in FIG. 7B.

FIG. 7B is a comparative plot of two power spectra at a PWM frequency of 50 Hertz and with D=0.5. It can be seen that the curve 32 for the inventive system lies below the band 31 for PWM systems throughout, in particular at low-to-medium frequencies where filtering is more difficult to apply.

The control system according to a preferred embodiment of invention offers conclusive advantages from both the power consumption and the electromagnetic emission standpoints.

In fact, its power consumption is on an equal term with that of a PWM control circuit according to the prior art. The power expended to the microcontroller itself is quite trivial compared to that absorbed by the load.

In addition, the control system according to a preferred embodiment of the invention requires no electrolytic capacitors. It also shows a low torque ripple, thus reducing the consumption of the brushes with respect to a PWM control circuit according to the prior art.

The embodiment of control system just described lends itself for use in regulating the power to any types of electric load powered by the power supply reference, such as lights, electric ovens, home appliances, etc.

Also, where necessary, any npn or pnp BJP devices, a Darlington, or an IGBT, may be substituted to the power transistor without the above circuit layout having to be modified.

A further embodiment of the control system, directed to improve the modulating capability of the system wherever the load 11 exhibits a strong inductive component, thus causing overvoltage problems, will now be described with reference to FIG. 9.

Figure 10A:
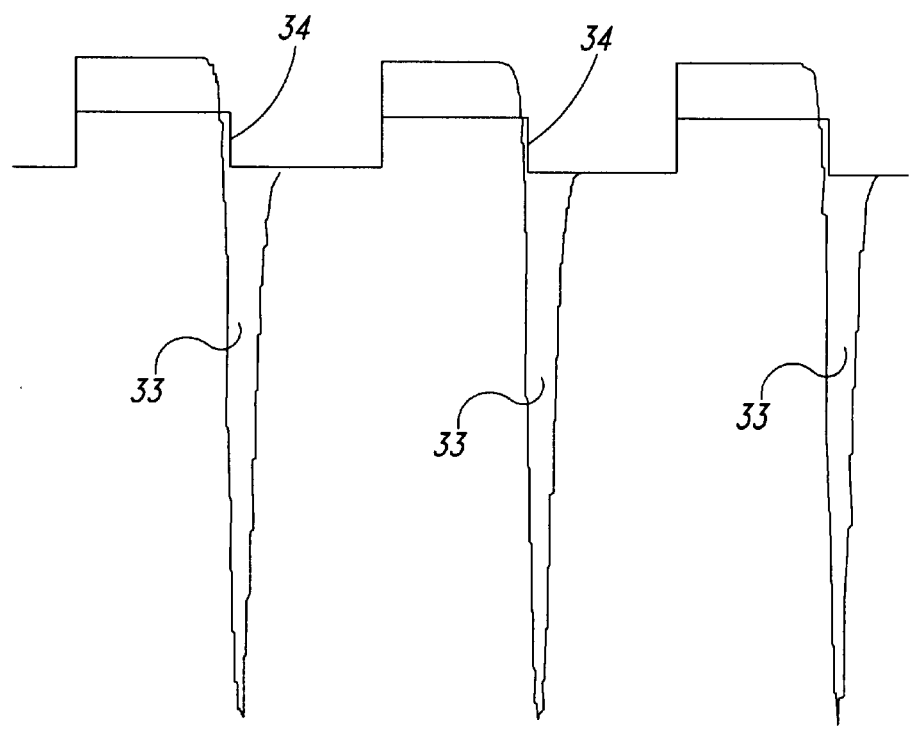
FIGS. 10A and 10B are comparative plots of voltage signals and PWM control signals, respectively, for loads having a large inductive component.

FIG. 10A is the plot of the voltages across a strongly inductive load, line 33, and the PWM control signal of the transistor Q1, line 34.

Every time that the transistor Q1 is turned off, large voltage variations occur across the load which are proportional to the product L(di/dt).

Since the derivative of current is of enormous magnitude upon switching, the current changing from few Amperes to zero, the inverse voltage spikes generated across the load also become quite large, unless the load inductance L is small, as shown in FIG. 10A.

Advantageously according to a preferred embodiment of the invention, the control circuit 20 is arranged to include a first 21 and a second monodirectional switch 23, connected in parallel to the load 11.

Moreover, the monodirectional switches 21 and 23 are connected in phase opposition one to another.

In particular, according to a preferred embodiment of the invention, the first monodirectional switch 21 comprises the series of a diode D21 and a feedback MOS transistor Q21, connected between the terminals M1 and M2 of the motor 11, while the second monodirectional switch 23 comprises the series of a diode D23 and a feedback MOS transistor Q23, also connected between the terminals M1 and M2 of the motor 11.

Advantageously, the feedback MOS transistors Q21 and Q23 are on when the main transistor Q1 is off, thus insuring, by means of the diodes D21 and D23, the feedback of the current generated by the voltage spikes due to a sudden turning off of the motor 11.

To this aim, the feedback transistors Q21 and Q23 are driven by means of a voltage signal which is a complement of the signal driving the main transistor Q1, i.e. the PWM signal issued by the microcontroller 14.

The control system 10 according to a preferred embodiment of the invention also includes a driving circuit 24 for the monodirectional switches 21 and 23.

In particular, the driving circuit 24 comprises substantially a first NOR logic gate 25 connected between the generator 12 and a terminal M1 of the motor 11, as well as a second NOR logic gate 26 connected between the terminal TD1 of the rectifier 13 and the terminal M2 of the motor 11.

So, the driving circuit 24 detects the line current in order to supply to the NOR gates 25 and 26 and thus drive the feedback transistors Q21 and Q23.

In more details, the first NOR gate 25 comprises a pair of bipolar transistors Q5–Q6 connected, in parallel to each other, between a power voltage supply Vcc and ground GND.

The transistors Q5 and Q6 have emitter terminals connected to each other and to ground GND, collector terminals connected to each other and, by means of a resistive element R25, to the power voltage supply Vcc, as well as base terminals connected to the generator 12 and the terminal M1 of the motor 11, respectively.

Moreover, the base terminals of transistors Q5 and Q6 are connected to each other and to ground GND by means of a first R5 and a second sensing resistive element R6, while the common collector terminals form a circuit node X21 connected to a gate terminal of the transistor Q21 of the first monodirectional switch 21.

In the same manner, the second NOR logic gate 26 comprises a pair of bipolar transistors Q7–Q8 connected, in parallel to each other, between the power voltage supply Vcc and ground GND.

The transistors Q7 and Q8 have emitter terminals connected to each other and to ground GND, collector terminals connected to each other and, by means of a resistive element R26, to the power voltage supply Vcc, as well as base terminals connected to the terminal TD1 of the rectifier 13 and the terminal M2 of the motor 11, respectively.

Moreover, the base terminals of transistors Q7 and Q8 are connected to each other and to ground GND by means of a first R7 and a second sensing resistive element R8, while the common collector terminals form a circuit node X23 connected to a gate terminal of the transistor Q23 of the second monodirectional switch 23.

Figure 9:
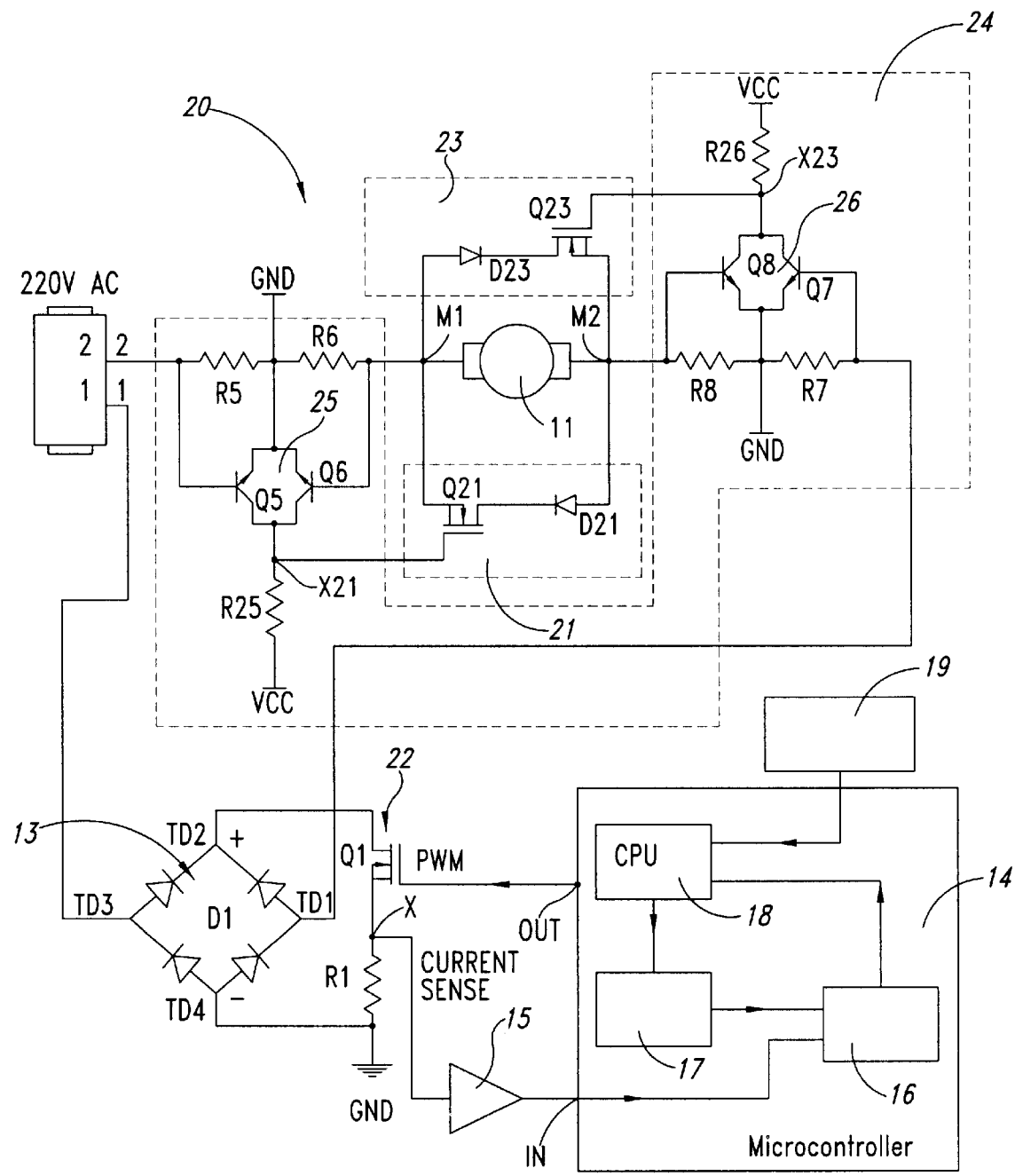
FIG. 9 is a further embodiment of the control system according to the invention.

The preferred embodiment of the invention of FIG. 9 is simple quite from the circuit standpoint and it does not need expensive voltage translators, as would be necessary in order to drive the feedback transistors Q21 and Q23 with a signal directly derived from the microcontroller 14.

In fact, such a signal would be referred to a ground voltage value (the same of the microcontroller 14) which is very different (even 300 mV) from the voltage values at the source terminals of feedback transistors Q21 and Q23, such voltage being also very different from each other.

In other words, the driving circuit 24 comprises respective pairs of line current sensing resistor, R5–R6 and R7–R8, which drive, by means of the NOR gates Q5–Q6 and Q7–Q8, the power MOS transistors Q21 and Q23, thus forcing the undesired overvoltages feedback and providing for the short-circuiting of the terminals M1 and M2 of the motor 11 simultaneously to the main transistor Q1 turning off and for the same time duration as the voltage spikes.

Thus, harmful overvoltages to the electronic components of the control circuit 20 are effectively obviated and the current is free to flow in the motor windings, maintaining unchanged its versus and does not causing any decreasing torque.

Figure 10B:
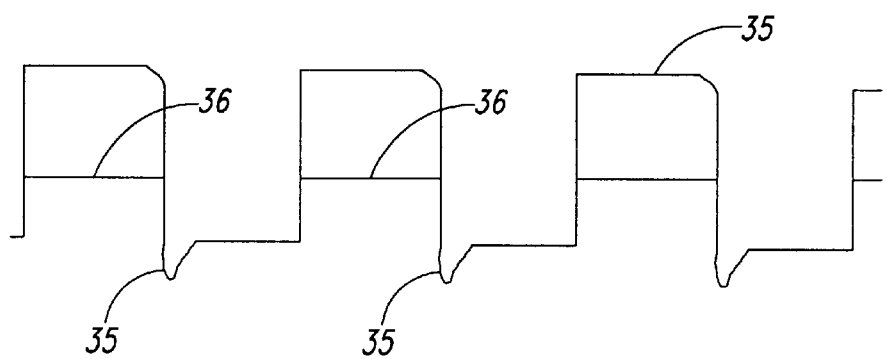

FIG. 10B is the plot of the voltage across the load (line 35) and the PWM control signal (line 36), concurrently with the feedback transistors Q21 and Q23 operation to short-circuit at the appropriate instants.

More particularly, when the potential V1 is greater than V2 and transistor Q1 is on, a current I flows throughout the motor line, such a current causing a voltage drop across the sensing resistors, thus chosen adequately small.

The resistors are connected to the first 25 and the second NOR logic gate 26 depending on the current I versus, the terminal directly connected to the rectifier 13 being conventionally considered as a negative voltage point.

In this way, when the main transistors Q1 is on:

1) if I>0

The voltage drop across the sensing resistive element R5 causes a current injection in the transistor Q5 base terminal, in such a way to saturate it and force to zero the switching-on gate-source voltage of the MOS transistor Q21 of the first monodirectional switch 21, the transistor being thus switched off.

In the same manner, the voltage drop across the sensing resistive element R8 causes a current injection in the transistor Q8 base terminal, in such a way to saturate it and force to zero the switching-on gate-source voltage of the MOS transistor Q23 of the second monodirectional switch 23, the transistor being thus switched off.

1) if I<0

The voltage drop across the sensing resistive element R6 causes a current injection in the transistor Q6 base terminal, in such a way to saturate it and force to zero the switching-on gate-source voltage of the MOS transistor Q21, which is thus switched off.

In the same manner, the voltage drop across the sensing resistive element R7 causes a current injection in the transistor Q8 base terminal, in such a way to saturate it and force to zero the switching-on gate-source voltage of the MOS transistor Q23, which is thus switched off.

Conversely, when V1 is greater than V2 and transistor Q1 is off, the line current I and thus the voltage drops across the sensing resistors are null (I=0).

In this case, there is no current injection in any of the transistors Q5–Q6 and Q7–Q8 base terminals, the transistors remaining off, thus causing the switching-on of the feedback MOS transistors Q21 and Q23, that have a gate-source voltage which is equal to the power supply voltage Vcc.

It should be noted that the control system 10 according to a preferred embodiment of the invention comprises a feedback operation performed by the monodirectional switches 21 and 23 and the driving circuit 24 which works in an automatic manner and independently from the line current-voltage shifting amount.

Figure 11A:
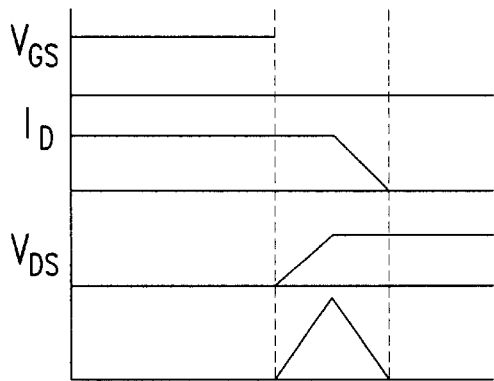
FIGS. 11A and 11B are plots of signals of a control system according to the prior art and of one according the invention, respectively.

It should be further added, for completeness' sake, that problems from the main transistor Q1 overheating may arise by reason of a large amount of power being dissipated at each turn-on/off and during PWM modulation, as shown in FIG. 11A.

To obviate this, a snubber circuit 30 is connected in parallel with the circuit leg 22 that includes the transistor Q1.

Figure 11B:
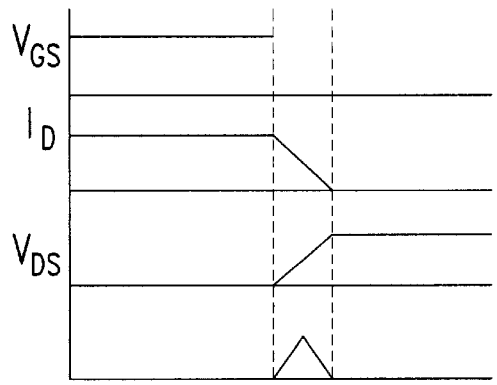
Figure 12:
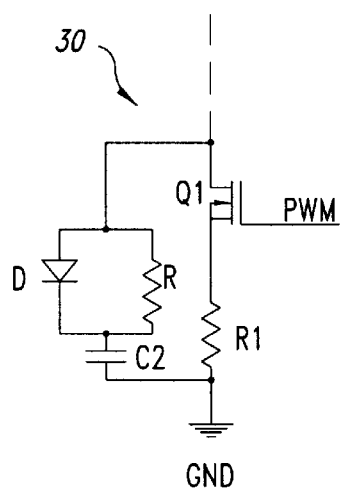
FIG. 12 is an optional detail of the control circuit incorporated to the system of FIG. 6.

Power dissipation through the transistor Q1 can be drastically reduced, as shown in FIG. 11B, by the provision of the snubber circuit 30, whose layout is illustrated by FIG. 12.

The snubber circuit 30 comprises a diode D connected in parallel with a resistor R, and a capacitor C2 connected in series with this parallel connection. The snubber circuit 30 subtracts current from the load 11 as the transistor Q1 is being turned off.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

We claim:

1. A power modulation control system using PWM pulses and comprising:
    an AC voltage generator;
    an inductive electric load; and
    a PWM control circuit incorporating at least one rectifier, wherein said electric load is connected between said generator and said rectifier, the control circuit including a pair of circuit elements connected in parallel to the load, both circuit elements being turned on if a power transistor is turned off, both circuit elements being turned off if the power transistor is turned on.

2. The control system according to claim 1, further comprising:
    first and second monodirectional switches connected to the electric load in parallel.

3. The control system according to claim 2, wherein said first monodirectional switch is connected to said second monodirectional switch in phase opposition.

4. The control system according to claim 2, wherein each of said monodirectional switches comprises a series of a diode transistor and a feedback transistor.

5. The control system according to claim 2, further comprising:
    a driving circuit for said monodirectional switches connected to said electric load to detect a line current sensing and drive said monodirectional switches in opposition with respect to said PWM pulses.

6. The control system according to claim 5, wherein said driving circuit comprises:
    a first NOR logic gate inserted between said generator and a first terminal of said electric load and connected to a first pair of sensing resistors, wherein said resistors are in turn inserted between said generator and said first terminal of said electric load; and
    a second NOR logic gate inserted between said rectifier and a second terminal of said electric load and connected to a second pair of sensing resistors, wherein said second pair of resistors is in turn inserted between said rectifier and said second terminal of said electric load, said sensing resistors detecting a line current sensing in order to supply said NOR logic gates and, through such gates, to drive said monodirectional switches.

7. The control system according to claim 6, wherein said NOR logic gates comprise respective pairs of bipolar transistors inserted, in parallel to each other, between a first and a second voltage reference and having base terminals connected to said sensing resistors.

8. The control system according to claim 7, wherein said bipolar transistors have common collector terminals to form respective drive circuit nodes for said monodirectional switches.

9. The control system according to claim 1, wherein said electric load is a universal motor operating with an alternating current.

10. The control system according to claim 1, wherein said rectifier is a diode bridge.

11. The control system according to claim 1, wherein said control circuit has a circuit leg connected in parallel to an output of the rectifier and comprising the power transistor supplied by said PWM pulses, as well as a snubber circuit in parallel with said circuit leg.

12. The control system according to claim 11, wherein said snubber circuit comprises a diode in parallel with a resistor, and a capacitor connected in series with this parallel connection.

13. A PWM controller comprising:
an AC voltage generator;
a PWM control circuit incorporating at least one rectifier;
an inductive electric load connected between said generator and said rectifier; and
first and second monodirectional switches connected to the electric load in parallel, the first and second monodirectional switches both being turned on if a power transistor is turned off, and the first and second monodirectional switches both being turned off if the power transistor is turned on.

14. The PWM controller according to claim 13, wherein said first monodirectional switch is connected to said second monodirectional switch in phase opposition.

15. The PWM controller according to claim 13, wherein each of said monodirectional switches comprises a series of a diode and a feedback transistors.

16. The PWM controller according to claim 13,
further comprising a driving circuit for said monodirectional switches connected to said electric load so as to detect a line current and to drive said monodirectional switches in opposition with respect to said PWM pulses.

17. The PWM controller according to claim 16, wherein said driving circuit comprises:
a first NOR logic gate inserted between said generator and a first terminal of said electric load and connected to a first pair of sensing resistors, wherein said resistors are in turn inserted between said generator and said first terminal of said electric load; and
a second NOR logic gate inserted between said rectifier and a second terminal of said electric load and connected to a second pair of sensing resistors, wherein said second pair of resistors is in turn inserted between said rectifier and said second terminal of said electric load, said sensing resistors detecting a line current in order to supply said NOR logic gates and, through such gates, to drive said monodirectional switches.

18. The PWM controller according to claim 17, wherein said NOR logic gates comprise respective pairs of bipolar transistors inserted, in parallel to each other, between a first and a second voltage reference and having base terminals connected to said sensing resistors.

19. The PWM controller according to claim 18, wherein said bipolar transistors have common collector terminals to form respective drive circuit node for said monodirectional switches.

20. An electronic device, comprising:
a universal motor operating with an alternating current;
an AC voltage generator connected to one terminal of said motor; and
a PWM controller incorporating at least one rectifier and connected to another terminal of said motor, said PWM controller further comprising first and second monodirectional switches connected to the motor in parallel, the first and second monodirectional switches both being turned on if a power transistor is turned off, and the first and second monodirectional switches both being turned off if the power transistor is turned on.

21. The electronic device according to claim 20, wherein said rectifier is a diode bridge.

22. The electronic device according to claim 20, wherein said PWM controller has a circuit leg connected in parallel to the output of the rectifier and comprising the power transistor supplied by a PWM signal.

23. The electronic device according to claim 20, wherein said first monodirectional switch is connected to said second monodirectional switch in phase opposition.

24. The electronic device according to claim 20, wherein each of said monodirectional switches comprises a series of a diode and a feedback transistor.

25. The electronic device according to claim 20, further comprising:
a driving circuit for said monodirectional switches connected to said motor so as to detect a line current and to drive said monodirectional switches in opposition with respect to said PWM pulses.

26. The electronic device according to claim 25, wherein said driving circuit comprises:
a first NOR logic gate inserted between said generator and a first terminal of said motor and connected to a first pair of sensing resistors, wherein said resistors are in turn inserted between said generator and said first terminal of said motor; and,
a second NOR logic gate inserted between said rectifier and a second terminal of said motor and connected to a second pair of sensing resistors, wherein said second pair of resistors is in turn inserted between said rectifier and said second terminal of said motor, said sensing resistors detecting a line current in order to supply said NOR logic gates and, through such gates, to drive said monodirectional switches.

27. The electronic device according to claim 26, wherein said NOR logic gates comprise respective pairs of bipolar transistors inserted, in parallel to each other, between a first and a second voltage reference and having the base terminals connected to said sensing resistors.

28. The electronic device according to claim 26, wherein said bipolar transistors have common collector terminals to form respective drive circuit node for said monodirectional switches.

29. The electronic device according to claim 22, further comprising:
a snubber circuit in parallel with said circuit leg.

30. The electronic device according to claim 29, wherein said snubber circuit comprises a diode in parallel with a resistor, and a capacitor connected in series with this parallel connection.

31. A power modulation control system using PWM pulses, the control system comprising:
- an AC voltage generator;
- an electric load;
- a control circuit incorporating at least one rectifier, wherein said electric load is connected between said generator and said rectifier;
- first and second monodirectional switches connected to the electric load in parallel; and
- a driving circuit for said monodirectional switches connected to said electric load to detect a line current sensing and drive said monodirectional switches in opposition with respect to said PWM pulses, wherein said driving circuit comprises:
  - a first NOR logic gate inserted between said generator and a first terminal of said electric load and connected to a first pair of sensing resistors, wherein said resistors are in turn inserted between said generator and said first terminal of said electric load; and
  - a second NOR logic gate inserted between said rectifier and a second terminal of said electric load and connected to a second pair of sensing resistors, wherein said second pair of resistors is in turn inserted between said rectifier and said second terminal of said electric load, said sensing resistors detecting a line current sensing in order to supply said NOR logic gates and, through such gates, to drive said monodirectional switches.

32. The control system according to claim 31 wherein said NOR logic gates comprise respective pairs of bipolar transistors inserted, in parallel to each other, between a first and a second voltage reference and having base terminals connected to said sensing resistors.

33. The control system according to claim 32 wherein said bipolar transistors have common collector terminals to form respective drive circuit nodes for said monodirectional switches.

34. A power modulation control system using PWM pulses, the control system comprising:
- an AC voltage generator;
- an electric load;
- a control circuit incorporating at least one rectifier, wherein said electric load is connected between said generator and said rectifier, wherein said control circuit has a circuit leg connected in parallel to an output of the rectifier and includes a power transistor supplied by said PWM pulses, as well as a snubber circuit in parallel with said circuit leg.

35. The control system according to claim 34 wherein said snubber circuit comprises a diode in parallel with a resistor, and a capacitor connected in series with this parallel connection.

36. A PWM controller, comprising:
- an AC voltage generator;
- a control circuit incorporating at least one rectifier;
- an electric load connected between said generator and said rectifier;
- first and second monodirectional switches connected to the electric load in parallel; and
- a driving circuit for said monodirectional switches connected to said electric load so as to detect a line current and to drive said monodirectional switches in opposition with respect to said PWM pulses, wherein said driving circuit comprises:
  - a first NOR logic gate inserted between said generator and a first terminal of said electric load and connected to a first pair of sensing resistors, wherein said resistors are in turn inserted between said generator and said first terminal of said electric load; and
  - a second NOR logic gate inserted between said rectifier and a second terminal of said electric load and connected to a second pair of sensing resistors, wherein said second pair of resistors is in turn inserted between said rectifier and said second terminal of said electric load, said sensing resistors detecting a line current in order to supply said NOR logic gates and, through such gates, to drive said monodirectional switches.

37. The PWM controller according to claim 36 wherein said NOR logic gates comprise respective pairs of bipolar transistors inserted, in parallel to each other, between a first and a second voltage reference and having base terminals connected to said sensing resistors.

38. The PWM controller according to claim 37 wherein said bipolar transistors have common collector terminals to form respective drive circuit node for said monodirectional switches.

39. An electronic device, comprising:
- a universal motor operating with an alternating current;
- an AC voltage generator connected to one terminal of said motor;
- a PWM controller incorporating at least one rectifier and connected to another terminal of said motor, said PWM controller further comprising first and second monodirectional switches connected to the motor in parallel, wherein said controller has a circuit leg connected in parallel to the output of the rectifier and includes a power transistor supplied by a PWM signal; and
- a snubber circuit in parallel with said circuit leg.

40. The electronic device according to claim 39 wherein said snubber circuit comprises a diode in parallel with a resistor, and a capacitor connected in series with this parallel connection.

* * * * *